(12) United States Patent
Huang et al.

(10) Patent No.: US 11,626,315 B2
(45) Date of Patent: Apr. 11, 2023

(54) SEMICONDUCTOR STRUCTURE AND PLANARIZATION METHOD THEREOF

(71) Applicant: TAIWAN SEMICONDUCTOR MANUFACTURING CO., LTD., Hsinchu (TW)

(72) Inventors: Chun-Jung Huang, Yunlin County (TW); Hsu-Shui Liu, Taoyuan (TW); Han-Wen Liao, Taichung (TW); Yu-Yao Huang, Taichung (TW); Hsiao-Wei Chen, Taichung (TW); Yung-Lin Hsu, Hsinchu (TW); Kuang-Huan Hsu, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 15/438,883

(22) Filed: Feb. 22, 2017

(65) Prior Publication Data

US 2018/0151412 A1  May 31, 2018

Related U.S. Application Data

(60) Provisional application No. 62/427,287, filed on Nov. 29, 2016.

(51) Int. Cl.
*H01L 21/3105* (2006.01)
*H01L 21/762* (2006.01)
*H01L 29/06* (2006.01)
*H01L 29/66* (2006.01)
*H01L 21/02* (2006.01)
(Continued)

(52) U.S. Cl.
CPC .... *H01L 21/76224* (2013.01); *H01L 21/0228* (2013.01); *H01L 21/02112* (2013.01); *H01L 21/02126* (2013.01); *H01L 21/02271* (2013.01); *H01L 21/02282* (2013.01); *H01L 21/31053* (2013.01); *H01L 21/76819* (2013.01); *H01L 21/76837* (2013.01); *H01L 29/0649* (2013.01); *H01L 29/665* (2013.01); *H01L 29/6659* (2013.01); *H01L 29/7833* (2013.01)

(58) Field of Classification Search
CPC .......... H01L 21/31053; H01L 21/3213; H01L 22/12; H01L 21/30625; H01L 21/76828; H01L 21/304; H01L 21/02013; H01L 21/463; H01L 21/31051; H01L 21/76819; H01L 21/461; H01L 21/76224; H01L 21/02282; H01L 29/0649
See application file for complete search history.

(56) References Cited

U.S. PATENT DOCUMENTS 5,516,729 A * 5/1996 Dawson ............ H01L 21/31053
257/E21.244
6,165,052 A * 12/2000 Yu ...................... B24B 37/013
451/41

(Continued)

*Primary Examiner* — Monica D Harrison
*Assistant Examiner* — John Lin
(74) *Attorney, Agent, or Firm* — Birch, Stewart, Kolasch & Birch, LLP (57) ABSTRACT

A planarization method includes forming a dielectric layer over a polish stop layer. The dielectric layer is polished until reaching the polish stop layer, and the polished dielectric layer has a concave top surface. A compensation layer is formed over the concave top surface. The compensation layer is polished.

20 Claims, 9 Drawing Sheets

(51) Int. Cl.
*H01L 21/768* (2006.01)
*H01L 29/78* (2006.01)

(56) References Cited

U.S. PATENT DOCUMENTS

| | | | | |
|---|---|---|---|---|
| 2003/0157768 | A1* | 8/2003 | Nakabayashi | H01L 21/31053 438/258 |
| 2007/0006804 | A1* | 1/2007 | Kang | B05C 11/08 118/612 |
| 2008/0121958 | A1* | 5/2008 | Izumi | H01L 27/11502 257/295 |
| 2008/0242081 | A1* | 10/2008 | Idani | B24B 37/042 438/653 |
| 2009/0286384 | A1* | 11/2009 | Wu | H01L 21/7684 438/692 |
| 2011/0215384 | A1* | 9/2011 | Ohmi | H01L 21/76897 257/E21.546 |
| 2011/0294233 | A1* | 12/2011 | Nakata | H01L 22/20 257/E21.53 |
| 2012/0220128 | A1* | 8/2012 | Shao | H01L 21/823456 438/692 |
| 2014/0017824 | A1* | 1/2014 | Iizumi | H01L 21/7684 438/16 |

* cited by examiner

SEMICONDUCTOR STRUCTURE AND PLANARIZATION METHOD THEREOF

PRIORITY CLAIM AND CROSS-REFERENCE

This application claims priority to U.S. Provisional Application Ser. No. 62/427,287, filed Nov. 29, 2016, which is herein incorporated by reference.

BACKGROUND

A chemical mechanical polishing (CMP) process is commonly used to planarize the surfaces of insulating film and conductive film on a semiconductor substrate. In general, the CMP process involves mechanically polishing a semiconductor wafer by holding and rotating the wafer against a polishing platen under different control parameters, such as a rotational speed of a polishing pad, downward force by a wafer carrier, polishing time, and flow rate of CMP slurry.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
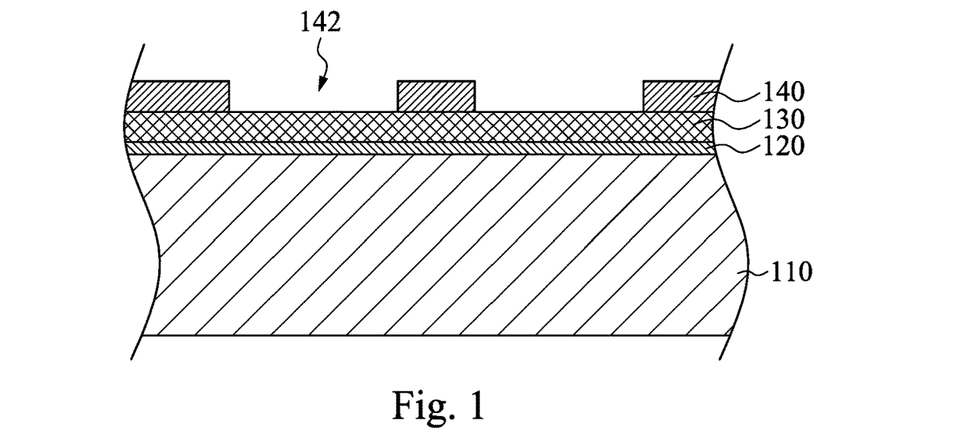
FIGS. 1-7 are cross-sectional views of a method for manufacturing a semiconductor structure according to some embodiments of the present disclosure.

FIGS. 1-7 are cross-sectional views of a method for manufacturing a semiconductor structure according to some embodiments of the present disclosure. Referring to FIG. 1, a pad layer 120 and a mask layer 130 are formed on the substrate 110. In some embodiments, the substrate 110 includes silicon. Other commonly used materials, such as carbon, germanium, gallium, arsenic, nitrogen, indium, and/or phosphorus, and the like, may also be included in the substrate 110. The substrate 110 may be formed of a single-crystalline material or a compound material, and may be a bulk substrate or a silicon-on-insulator (SOI) substrate. The pad layer 120 may be a thin film including silicon oxide formed, for example, using a thermal oxidation process. The pad layer 120 may act as an adhesion layer between the substrate 110 and the mask layer 130. The pad layer 120 may also act as an etch stop layer for etching the mask layer 130. In some embodiments, the mask layer 130 is formed of silicon nitride, for example, using low-pressure chemical vapor deposition (LPCVD). In some embodiments, the mask layer 130 is formed by thermal nitridation of silicon, plasma-enhanced chemical vapor deposition (PECVD), or plasma anodic nitridation. Moreover, the mask layer 130 is used as a hard mask during subsequent photolithography processes. Thereafter, a photoresist layer 140 is formed on the mask layer 130 and is then patterned, forming at least one opening 142 in the photoresist layer 140.

Figure 2:
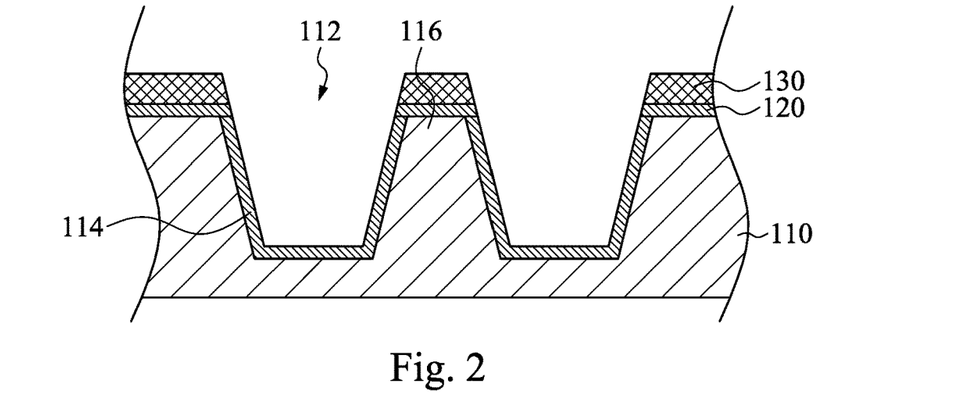

Referring to FIG. 2, the mask layer 130 and the pad layer 120 are etched through the opening 142 (see FIG. 1), exposing the underlying substrate 110. The exposed substrate 110 is then etched, forming at least one trench 112. As a result, the substrate 110 has at least one raised portion 116 adjacent to the trench 112. For example, the trench 112 is between two raised portions 116. The photoresist layer 140 is then removed. Next, a cleaning may be optionally performed to remove a native oxide of the substrate 110 in some embodiments. The cleaning may be performed using diluted hydrofluoric (HF) acid. A liner oxide layer 114 can be then optionally formed in the trench 112. In some embodiments, the liner oxide layer 114 may be a thermal oxide having a thickness between about 20 Å to about 500 Å. In some embodiments, the liner oxide layer 114 may be formed using in-situ steam generation (ISSG). In yet other embodiments, the liner oxide layer 114 may be formed using a deposition technique that can form conformal oxide layers, such as selective area chemical vapor deposition (SACVD) and the like. The formation of the liner oxide layer 114 may round the corners of the trench 112, which reduces the electrical fields, and hence improves the performance of the resulting integrated circuit.

Figure 3:
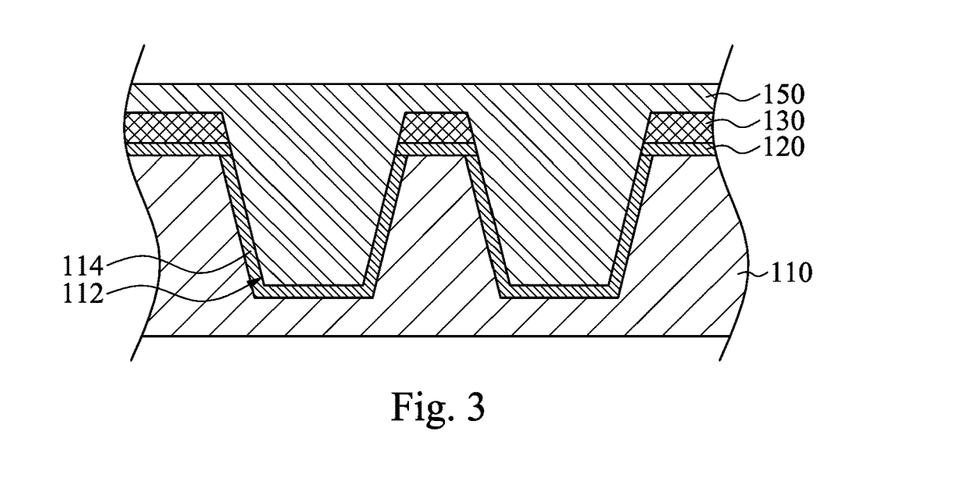

Referring to FIG. 3, a dielectric layer 150 is formed over the mask layer 130, such that the trench 112 is filled with the dielectric layer 150. The dielectric layer 150 may include silicon oxide, silicon oxynitride, silicon nitride, low-k materials, or other suitable materials. In some embodiments, the dielectric layer 150 is formed using a high aspect ratio process (HARP), which may be an enhanced HARP (EHARP). In alternative embodiments, the dielectric layer 150 is formed using other methods having good gap-filling ability, such as spin-on.

Figure 4:
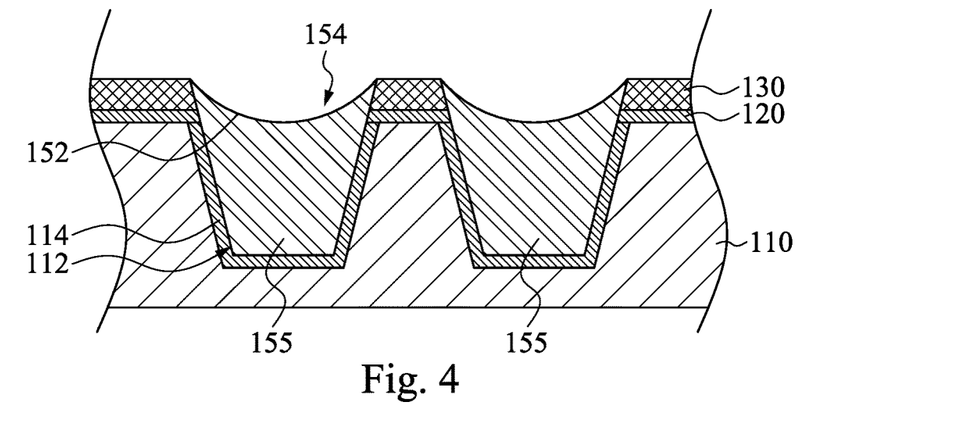

Referring to FIG. 4, a chemical mechanical polish (CMP) step may be performed to remove an overfilled portion of the dielectric layer 150 outside the trenches 112 above the mask layer 130, while leaving other portions of the dielectric layer 150 in the trench 112, and the remaining portions of the dielectric layer 150 in the trench 112 are referred to as shallow trench isolation (STI) structures 155. In other words, the dielectric layer 150 is polished until reaching the mask layer 130, and the mask layer 130 can thus act as a polish stop layer. CMP process may cause "dishing" of the dielectric layer 150 because of loading effect of the CMP. As a result, in some embodiments, concave (e.g., dish-shaped) top surfaces 152 of the STI structures 155 distal to a bottom of the trench 112 may be formed in the trench 112, as shown in FIG. 4. The "dishing" of the top surface 152 may create a concave parabolic contour with a lower central region and a higher peripheral region, for example.

Figure 5:
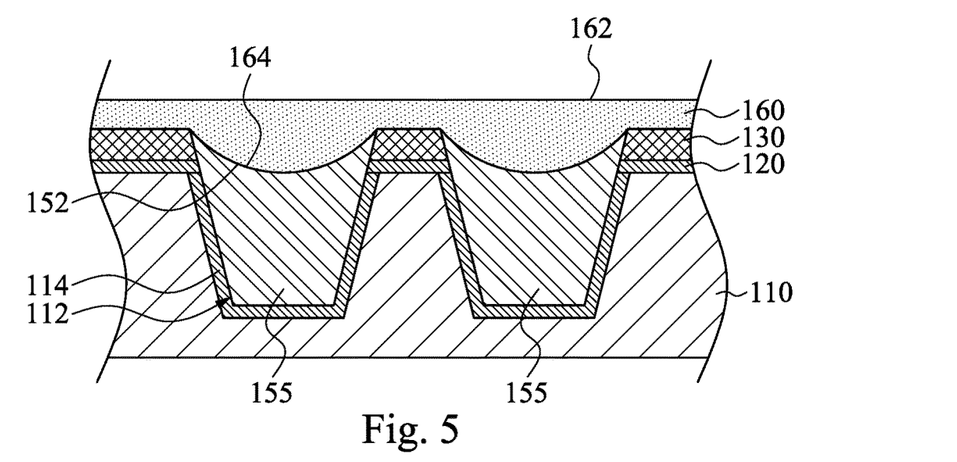

Referring to FIG. 5, after the dielectric layer 150 is polished, a compensation layer 160 is formed over the concave top surfaces 152 of the STI structures 155. In some embodiments, the compensation layer 160 may be formed over the mask layer 130 and the dielectric layer 150 by coating (e.g., a spin coating process). Such a coating process may be advantageous to form a non-conformal layer over a rough surface, and hence the compensation layer 160 may be non-conformally formed over the concave top surface 152 of the dielectric layer 150. Such a non-conformal formation of the compensation layer 160 makes top and bottom surfaces 162 and 164 thereof have different geometries. As such, in some embodiments where the bottom surface 164 is conformal to the concave top surface 152 of the STI structure 155, the non-conformal formation may be advantageous to form the top surface 162 with less curvature than that of the bottom surface 164. Therefore, the "dishing" of STI structures 155 can be compensated or mitigated by the compensation layer 160. In some other embodiments, the compensation layer 160 may be non-conformally formed by suitable depositing techniques, such as chemical vapor deposition (CVD) or atomic layer deposition (ALD), to deposit a layer thick enough such that its top surface has less curvature than its bottom surface. In some embodiments, the compensation layer 160 may include SiCl4, SiH4, SiCxOyNz, or CxOyNz, as examples.

In some embodiments, portions of the bottom surface 164 of the compensation layer 160 is in contact with the concave top surfaces 152 of STI structures 155, and hence these portions of bottom surface 164 have geometry substantially the same as that of the concave top surfaces 152 of STI structures 155. For example, these portions of bottom surface 164 are convex surfaces protruding toward the semiconductor substrate 110, and these convex surfaces are in contact with the concave top surfaces 152 of the STI structures 155.

In some embodiments, after the dielectric layer 150 is polished, the dielectric layer 150 may be inspected by a metrology tool to obtain the thickness and uniformity of the dielectric layer 150, and the measured data of the dielectric layer 150 may be fed forward a tool for forming the compensation layer 160. As a result, through the inspection of the dielectric layer 150, a step time of forming the compensation layer 160 may be determined. For example, a step time of coating the compensation layer 160 or a step time of depositing the compensation layer 160 is determined by computing the removal rate of polishing the dielectric layer 150. In addition, the measured data of the dielectric layer 150 may be also used to determine whether the dielectric layer 150 is to be reworked. Therefore, defects of the dielectric layer 150 due to the polish step may be cured by reworking. In other words, there is a chance to rework for the polished dielectric layer 150, thereby improving yield rate of products.

Moreover, in some embodiments, after the dielectric layer 150 is polished, a baking step may be performed to the dielectric layer 150, such that the dielectric layer 150 is cured before the inspection of the dielectric layer 150. As a result, the accuracy of inspecting the thickness and uniformity of the dielectric layer 150 may be improved.

Figure 6:
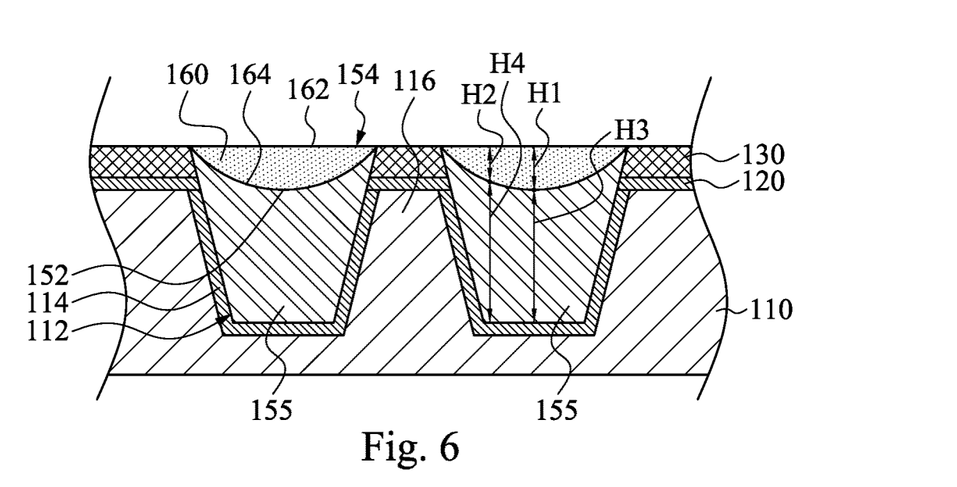

Referring to FIG. 6, after the compensation layer 160 is formed over the mask layer 130 and the dielectric layer 150, the top surface 162 of the compensation layer 160 distal to the dielectric layer 150 may be polished until reaching the mask layer 130. As a result, the remaining portions of compensation layer 160 are embedded in recesses 154 in the STI structures 155. In some embodiments, the compensation layer 160 is polished with a low removal rate in a buffing step. The removal rate of polishing the compensation layer 160 is less than the removal rate of polishing the dielectric layer 150, and the low removal rate of polishing the compensation layer 160 may be advantageous to reduce "dishing" of the compensation layer 160.

In some embodiments, after the compensation layer 160 is formed over the dielectric layer 150 and the mask layer 130, the compensation layer 160 may be inspected by a metrology tool to obtain the thickness and uniformity of the compensation layer 160, and the measured data of the compensation layer 160 may be fed forward a tool for polishing the compensation layer 160. As a result, through the inspection of the compensation layer 160, a step time of polishing the compensation layer 160 may be determined.

Moreover, in some embodiments where the compensation layer 160 is formed using a coating operation, the coated material may have insufficient stiffness, and hence a baking operation may be performed to the compensation layer 160 after the coating operation, such that the compensation layer 160 can be cured to reach acceptable stiffness. For example, the formation of the compensation layer 160 includes coating a layer of compensation material over the concave top surface 152 of the dielectric layer 150, and then baking the layer of compensation material. Moreover, the baking operation is performed before the inspection of the compensation layer 160, and hence the accuracy of inspecting the thickness and uniformity of the compensation layer 160 may be improved.

As shown in FIG. 6, in some embodiments, the compensation layer 160 has a spatially varied thickness for compensating the recess 154 in the STI structure 155. In other words, the thickness of the compensation layer 160 is non-uniform along the top surface 152 of the STI structure 155. For example, the central thickness H1 of the compensation layer 160 is greater than the peripheral thickness H2 of the compensation layer 160. Moreover, the central thickness H3 of the STI structure 155 is less than the peripheral thickness H4 of the STI structure 155. Accordingly, the thickness of the compensation layer 160 increases as the thickness of the STI structure 155 decreases. Stated differently, the thickness of STI structure 155 increases as the thickness of the compensation layer 160 decreases. That is to say, the thickness of the compensation layer 160 changes as a function of the thickness of the STI structure 155. Moreover, the bottom surface 164 of compensation layer 160 has a slope that increases as the thickness of the compensation layer 160 decreases, so as to form the convex bottom surface 164. By such structural relations between the compensation layer 160 and STI structure 155, the "dishing" of STI structure 155 can be compensated or counterbalanced by the compensation layer 160.

In some embodiments, after the compensation layer 160 is polished, the compensation layer 160 may be inspected by a metrology tool to obtain the thickness and uniformity of the compensation layer 160, and the measured data of the compensation layer 160 may be send to a tool of a subsequent process. Moreover, in some embodiments, after the compensation layer 160 is polished, a baking step may be performed to the compensation layer 160, such that the compensation layer 160 is cured before the inspection of the compensation layer 160. Therefore, the accuracy of inspecting the thickness and uniformity of the buffed compensation layer 160 may be improved.

Figure 7:
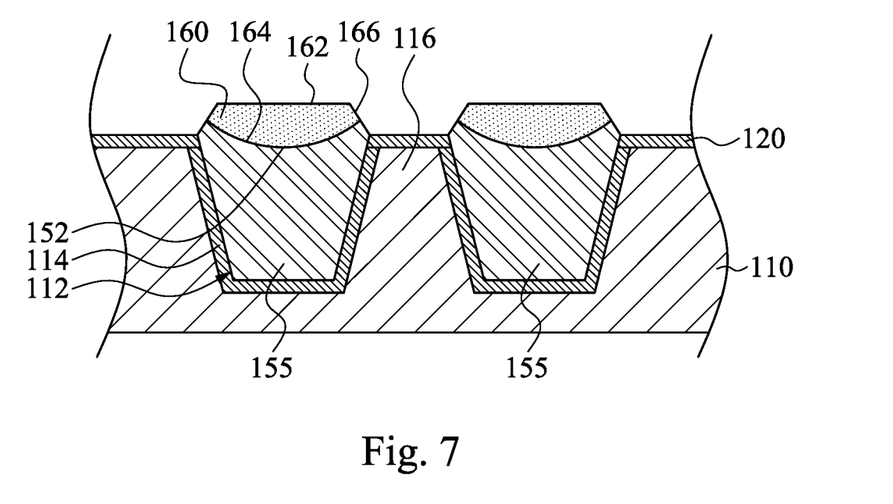

Referring to FIG. 7, the mask layer 130 is removed. The mask layer 130, if formed of silicon nitride, may be removed, for example, by a wet process using hot $H_3PO_4$. During the process of removing the mask layer 130, the compensation layer 160 may be rounded. For example, the compensation layer 160 has an oblique sidewall 166 connecting the bottom surface 164 and the top surface 162. Thereafter, suitable operations for manufacture of transistors, such as dummy gate formation, gate spacers formation, source/drain regions formation, dummy gate replacement, and so on, may be performed to the structure in FIG. 7 to form transistors over the raised portions 116, and the raised portions 116 can also be referred to as active regions defined by the STI structures 155.

Figure 8:
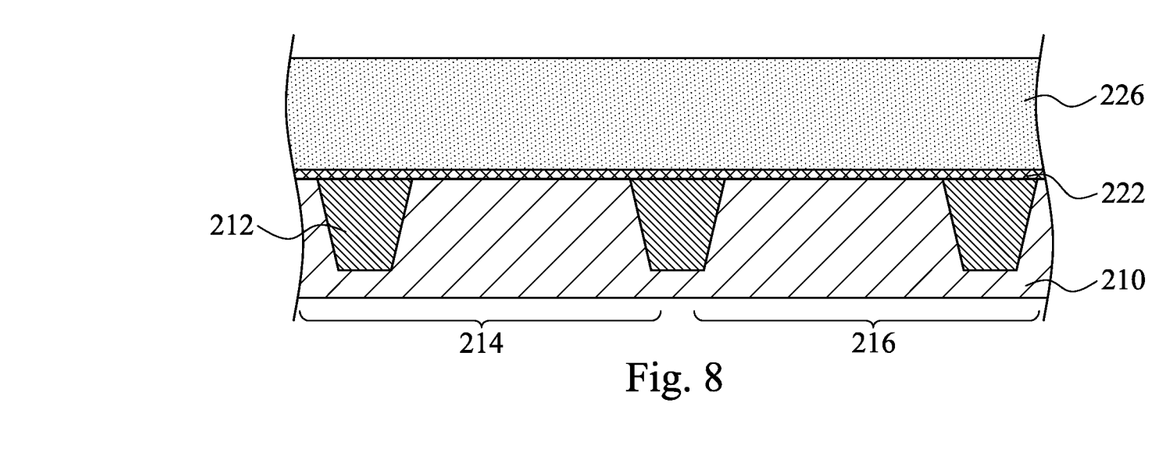
FIGS. 8-17 are cross-sectional views of a method for manufacturing a semiconductor structure according to some embodiments of the present disclosure.

FIGS. 8-17 are cross-sectional views of a method for manufacturing a semiconductor structure according to some embodiments of the present disclosure. Referring to FIG. 8, at least one shallow trench isolation (STI) region 212 is formed in a semiconductor substrate 210. The formation of the STI regions 212 may be similar to that of the STI structures 155 discussed, and will not be repeated in the following description. In some embodiments, compensation layers, such as compensation layers 160 as shown in FIG. 7, can be formed over the STI regions 212 for compensating "dishing" of the STI regions 212. In some other embodiments, compensation layers may be absent over the STI regions 212. The substrate 210 may be formed of commonly used semiconductor materials and structures as discussed previously. The STI regions 212 define a PMOS region 214 and a NMOS region 216. A gate dielectric layer 222 and a dummy gate electrode layer 226 are then sequentially formed on the substrate 210 using suitable deposition techniques, such as ALD or CVD. In some embodiments, the gate dielectric layer 222 is formed of silicon oxide. In alternative embodiments, the gate dielectric layer 222 includes materials having high dielectric constants (high-k). The high-k materials include metal oxides such as $HfO_2$, $ZrO_2$, silicate HfSiON, metal alloy oxides such as HfZrO, HfTaO, HfTiO, HfAlO, and combinations thereof. In some embodiments, the dummy gate electrode layer 226 includes polysilicon, as example.

Figure 9:
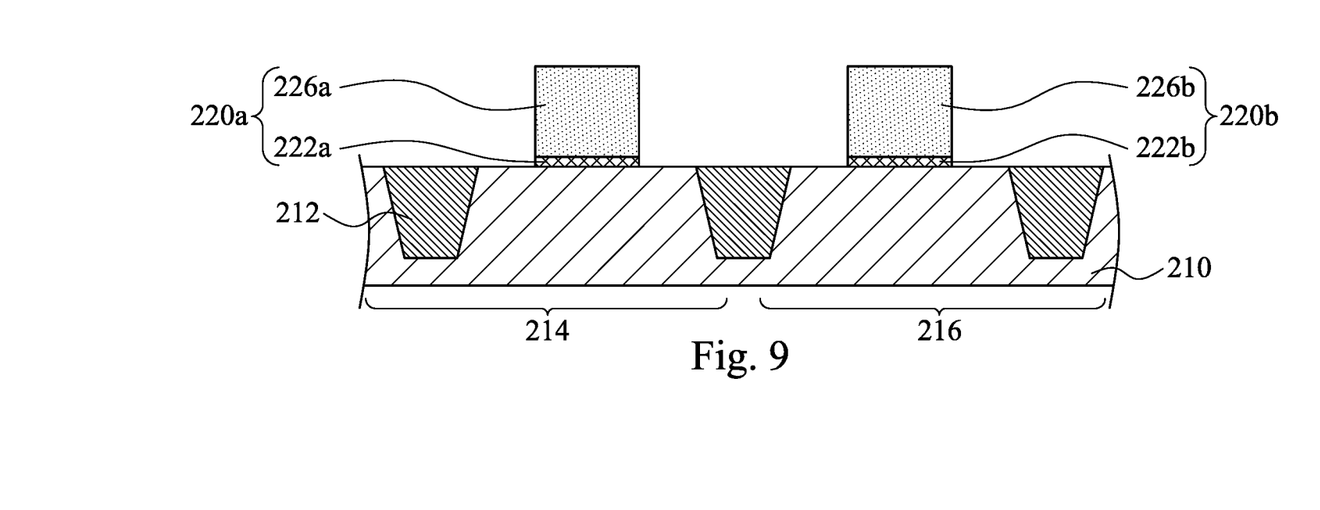

Referring to FIG. 9, the gate dielectric layer 222 and the dummy gate electrode layer 226 may be patterned to form the gate stack 220a and 220b. The gate stack 220a is formed in the PMOS region 214, and the gate stack 220b is formed in the NMOS region 216. As a result, the gate stack 220a includes the gate dielectric 222a on the substrate 210, and the dummy gate electrode layer 226a on the gate dielectric 222a. The gate stack 220b includes the gate dielectric 222b on the substrate 210 and the dummy gate electrode layer 226b on the gate dielectric 222b.

Figure 10:
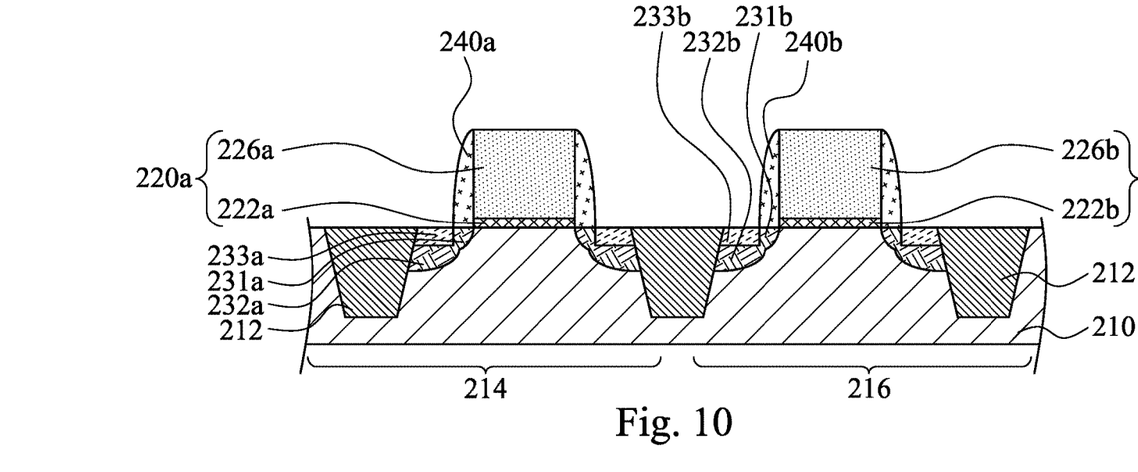

Next, as illustrated in FIG. 10, lightly doped source and drain (LDD) regions 231a are optionally formed in PMOS region 214 by implanting a p-type impurity. Similarly, LDD regions 231b are optionally formed in NMOS region 216 by implanting an n-type impurity. Masks (not shown) are optionally formed to mask one of the PMOS region 214 and NMOS region 216 when the other region is implanted.

Thereafter, a pair of gate spacers 240a and a pair of gate spacers 240b are then formed. The gate spacers 240a are formed along sidewalls of the gate dielectric 222a and the dummy gate electrode layer 226a. The gate spacers 240b are formed along sidewalls of the gate dielectric 222b and the dummy gate electrode layer 226b. In other words, the two gate spacers 240a are respectively adjacent to two opposite sidewalls of the gate stack 220a, and the two gate spacers 240b are respectively adjacent to two opposite sidewalls of the gate stack 220b. The gate spacers 240a and 240b may be made of a material including oxide, silicon nitride, oxynitride or any combinations thereof. Each of the gate spacers 240a and 240b may include a single layer or a composite layer. The gate spacers 240a and 240b may be formed by blanket depositing a dielectric layer over the substrate 210 and the gate stack 220a and 220b using thermal process, low pressure chemical vapor deposition (LPCVD), or plasma enhanced vapor deposition (PECVD), then anisotropically etching the dielectric material to remove the dielectric material from horizontal surfaces but not from the sidewalls of the gate stack 220a and 220b. In some embodiments, the gate spacers 240a and 240b include a silicon nitride layer formed on a $SiO_2$ layer.

Figure 16:
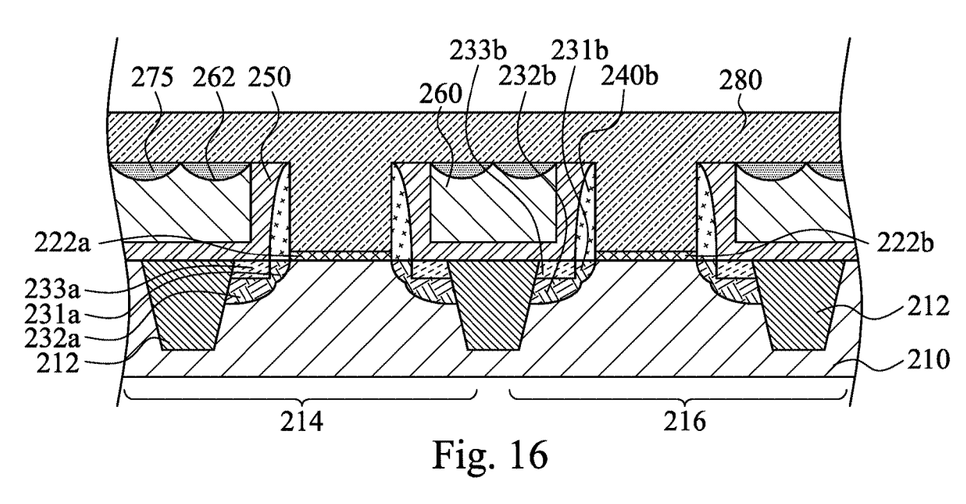
Figure 17:
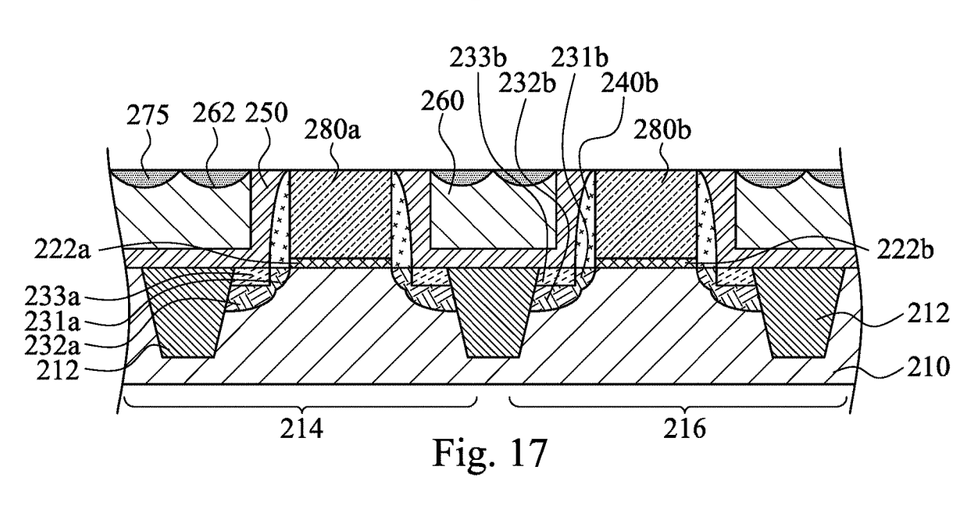

In subsequent steps, source/drain regions 232a and 232b are formed in the substrate 210. The source/drain regions 232a are formed in the PMOS region 214, and the source/drain regions 232b are formed in the NMOS region 216. In alternative embodiments, stressors (not shown) are formed to improve stresses in channel regions. For example, SiGe stressors (not shown) may be formed in the PMOS region 214, and SiC stressors (not shown) may be formed in the NMOS region 216. Anneals such as rapid thermal anneal (RTA), laser anneal, and flush anneal, are performed to activate the LDD regions 231a and 231b and the source/drain regions 232a and 232b. In some embodiments, the activation steps may be performed any time before the formation of metal gates, which step is illustrated in FIG. 16.

Next, a silicidation process is optionally performed to form silicide regions 233a on the source/drain regions 232a, and silicide regions 233b on the source/drain regions 232b. The silicidation process may include blanket forming a metal layer, which may include nickel, platinum, palladium, titanium, cobalt, and combinations thereof, and heating the substrate, so that the silicon in the source/drain regions 232a and 232b reacts with the metal where contacted, forming the metal silicide regions 233a and 233b. The un-reacted metal is selectively removed through the use of an etchant that attacks metal but does not attack silicide.

Figure 11:
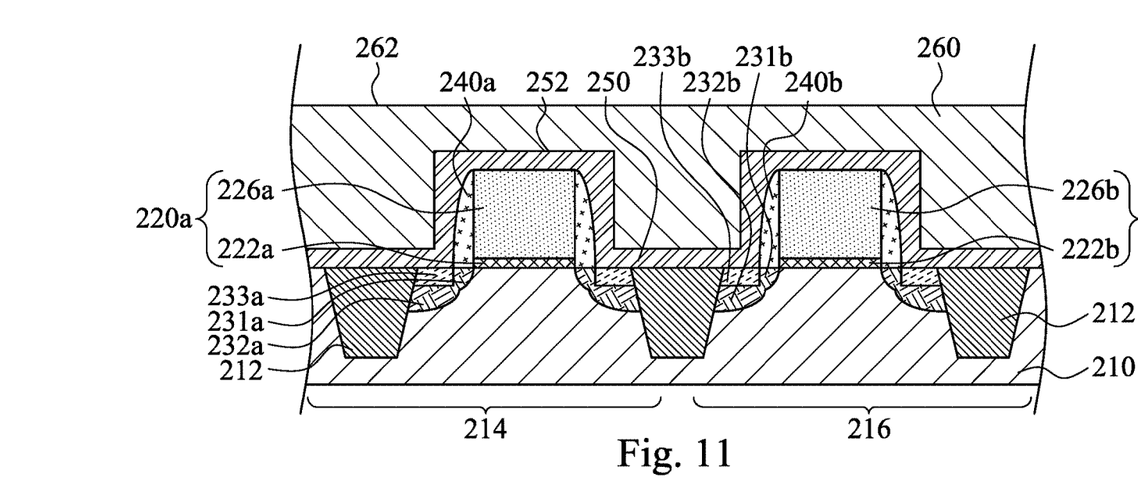

Referring to FIG. 11, a contact etch stop layer (CESL) 250 is formed over the STI regions 212, the source/drain regions 232a and 232b, the gate spacers 240a and 240b, and the gate stacks 220a and 220b. The CESL 250 is a dielectric layer formed using suitable deposition techniques. In some embodiments, the CESL 250 is silicon nitride. In other embodiments, silicon dioxide, silicon oxynitride (SiON), and their combinations may also be used. After the CESL 250 is formed, an interlayer dielectric (ILD) layer 260 may be formed over the CESL 250 and the source/drain regions 232a and 232b. The ILD layer 260 has a top surface 262 higher than a top surface 252 of the CESL 250. In some embodiments, the ILD layer 260 may include a material different from CESL 250. For example, the ILD layer 260 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 260 may be formed using, for example, CVD, ALD, spin-on-glass (SOG) or other suitable techniques.

Figure 12:
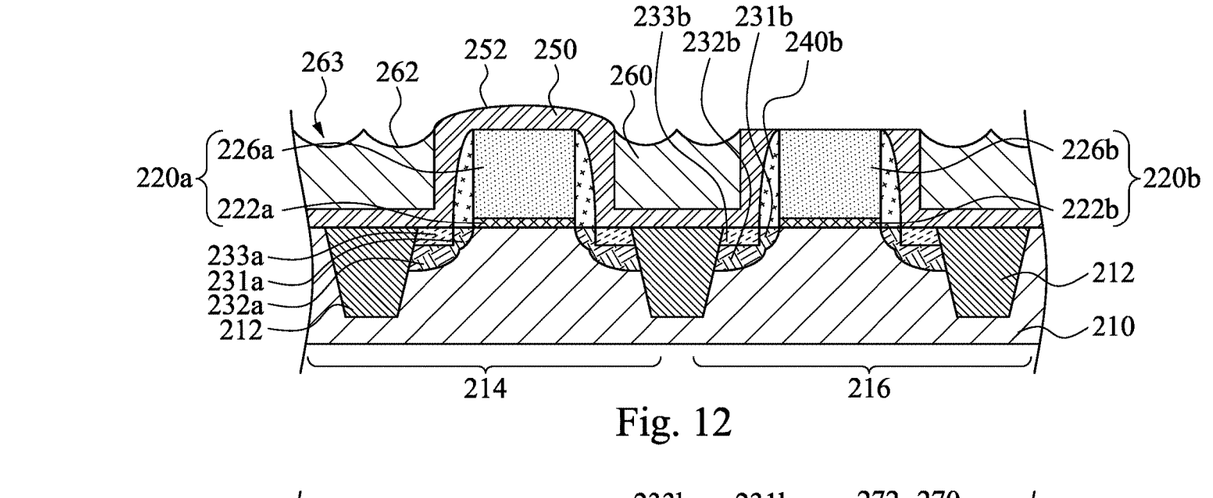

Referring to FIG. 12, a chemical mechanical polish (CMP) is performed to remove portions of the ILD layer 260 and the CESL 250 above the dummy gate electrode layer 226a of the gate stack 220a and the dummy gate electrode layer 226b of the gate stack 220b, such that the ILD layer 260 is polished until reaching the CESL 250. In other words, the CESL 250 can act as a polish stop layer in this CMP process. CMP process may cause "dishing" of the ILD layer 260 because of loading effect of the CMP. As a result, in some embodiments, the concave (e.g., dish-shaped) top surfaces 262 of the ILD layer 260 distal to the substrate 210 may be formed, as shown in FIG. 12. The "dishing" of the top surface 262 may create a concave parabolic contour with a lower central region and a higher peripheral region, for example.

Figure 13:
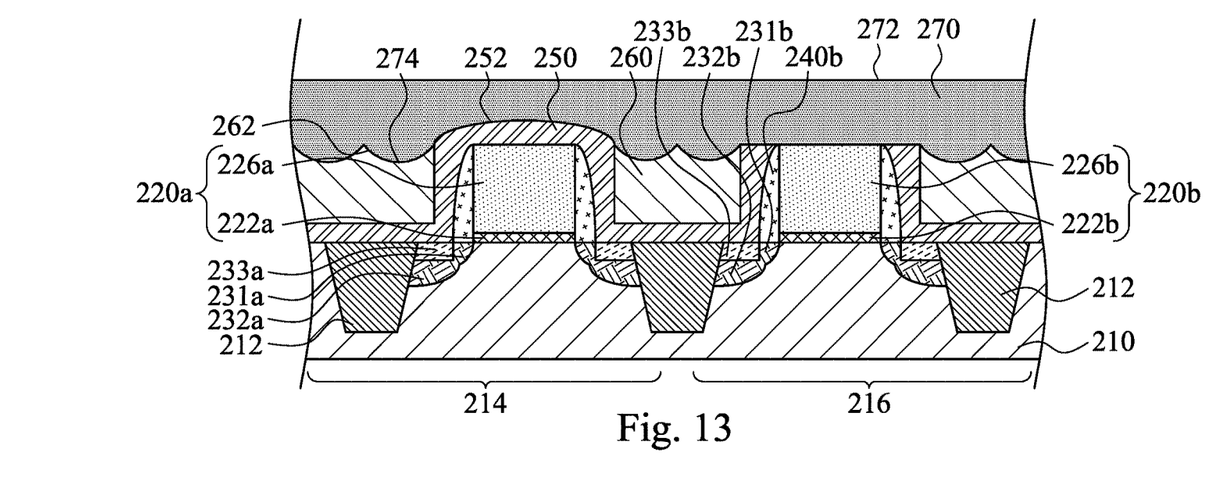

Referring to FIG. 13, after the ILD layer 260 is polished, a compensation layer 270 is formed over the concave top surfaces 262 of the ILD layer 260. In some embodiments, the compensation layer 270 may be formed over the CESL 250 and the ILD layer 260 by coating (e.g., a spin coating process). Such a coating process may be advantageous to form a non-conformal layer over a rough surface, and hence the compensation layer 270 may be non-conformally formed over the concave top surface 262 of the ILD layer 260. Such a non-conformal formation of the compensation layer 270 makes top and bottom surfaces 272 and 274 thereof have different geometries. As such, in some embodiments where the bottom surface 274 is conformal to the concave top surface 262 of the ILD layer 260, the non-conformal formation may be advantageous to form the top surface 272 with less curvature than that of the bottom surface 274. Therefore, the "dishing" of ILD layer 260 can be compensated or mitigated by the compensation layer 270. In some other embodiments, the compensation layer 270 may be non-conformally formed by suitable depositing techniques, such as chemical vapor deposition (CVD) or atomic layer deposition (ALD), to deposit a layer thick enough such that its top surface has less curvature than its bottom surface. In some embodiments, the compensation layer 270 may include $SiCl_4$, $SiH_4$, $SiC_xO_yN_z$, or $C_xO_yN_z$, as examples.

In some embodiments, portions of the bottom surface 274 of the compensation layer 270 is in contact with the concave top surfaces 262 of ILD layer 260, and hence these portions of bottom surface 274 have geometry substantially the same as that of the concave top surfaces 262 of ILD layer 260. For example, these portions of bottom surface 274 are convex surfaces protruding toward the semiconductor substrate 210, and these convex surfaces are in contact with the concave top surfaces 262 of the ILD layer 260.

In some embodiments, after the ILD layer 260 is polished, the ILD layer 260 may be inspected by a metrology tool to obtain the thicknesses and uniformities of the ILD layer 260, and the measured data of the ILD layer 260 may be fed forward a tool for forming the compensation layer 270. As a result, through the inspection of the ILD layer 260, a step time of forming the compensation layer 270 may be determined. For example, a step time of coating the compensation layer 270 or a step time of depositing the compensation layer 270 is determined by computing the removal rate of polishing the ILD layer 260. In addition, the measured data of the ILD layer 260 may be also used to determine whether the ILD layer is to be reworked. Therefore, defects of the ILD layer 260 due to the polish step may be cured by reworking. In other words, there is a chance to rework for the ILD layer 260, thereby improving yield rate of products.

Moreover, in some embodiments, after the ILD layer 260 is polished, a baking step may be performed to the ILD layer 260, such that the ILD layer 260 is cured before the inspections of the ILD layer 260. As a result, the accuracy of inspecting the thicknesses and uniformities of the ILD layer 260 may be improved.

Figure 14:
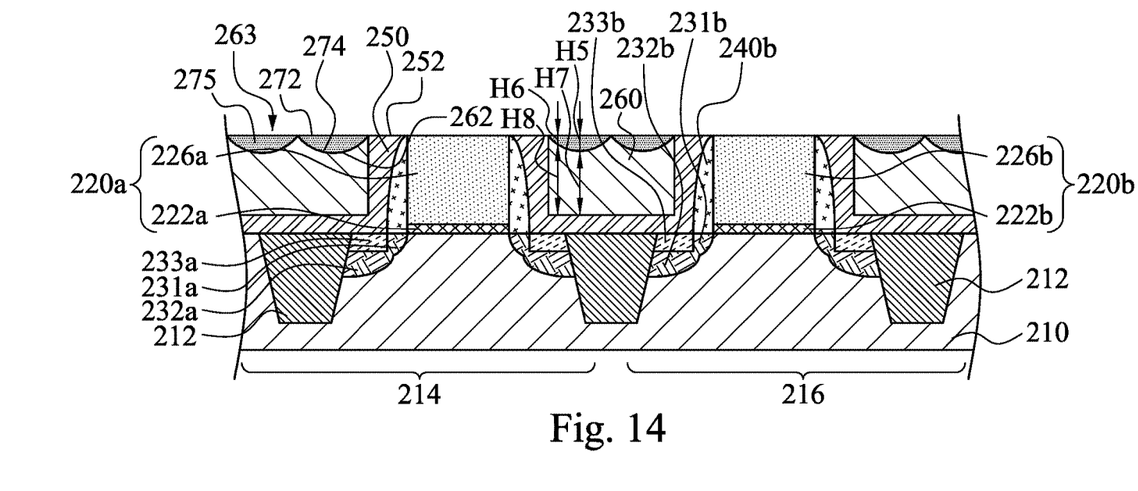

Referring to FIG. 14, after the compensation layer 270 is formed over the CESL 250 and the ILD layer 260, the top surface 272 of the compensation layer 270 distal to the ILD layer 260 may be polished until reaching the CESL 250. As a result, the remaining portions of compensation layer 270 are embedded in recesses 263 in the ILD layer 260. The remaining portions of compensation layer 270 over the top surfaces 262 of the ILD layer 260 are referred to as compensation structures 275. The top and bottom surfaces 272 and 274 of the compensation structure 275 are separated by a distance that is non-uniform along the top surface 262 of the ILD layer 260. Moreover, the top surface 252 of the CESL 250 adjoins the top surface 272 of the compensation structure 275. In some embodiments, the compensation layer 270 is polished with a low removal rate in a buffing step. The removal rate of polishing the compensation layer 270 is less than the removal rate of polishing the ILD layer 260, and the low removal rate of polishing the compensation layer 270 may be advantageous to reduce "dishing" of the compensation layer 270.

In some embodiments, after the compensation layer 270 is formed over the ILD layer 260 and the CESL 250, the compensation layer 270 may be inspected by a metrology tool to obtain the thickness and uniformity of the compensation layer 270, and the measured data of the compensation layer 270 may be fed forward a tool for polishing the compensation layer 270. As a result, through the inspection of the compensation layer 270, a step time of polishing the compensation layer 270 may be determined.

Moreover, in some embodiments where the compensation layer 270 is formed using a coating operation, the coated material may have insufficient stiffness, and hence a baking operation may be performed to the compensation layer 270 after the coating operation, such that the compensation layer 270 can be cured to reach acceptable stiffness. For example, the formation of the compensation layer 270 includes coating a layer of compensation material over the concave top surface 262 of the ILD layer 260, and then baking the layer of compensation material. Moreover, the baking operation is performed before the inspection of the compensation layer 270, and hence the accuracy of inspecting the thickness and uniformity of the compensation layer 270 may be improved.

As shown in FIG. 14, the compensation structure 275 has the top surface 272 with less curvature than that of the top surface 262 of the ILD layer 260. In some embodiments, the compensation structure 275 has a spatially varied thickness for compensating the recess 263 in the ILD layer 260. In other words, the thickness of the compensation structure 275 is non-uniform along the top surface 262 of the ILD layer 260, and changes as a function of the thickness of the ILD layer 260. For example, the central thickness H5 of the compensation structure 275 is greater than the peripheral thickness H6 of the compensation structure 275. Moreover, the thickness H7 of the ILD layer 260 is less than the thickness H8 of the ILD layer 260. Accordingly, the thickness of the compensation structure 275 increases as the thickness of the ILD layer 260 decreases. Stated differently, the thickness of ILD layer 260 increases as the thickness of the compensation structure 275 decreases. Moreover, the bottom surface 274 of compensation structure 275 has a slope that increases as the thickness of the compensation structure 275 decreases, so as to form the convex bottom surface 274. By such structural relations between the compensation structure 275 and ILD layer 260, the "dishing" of ILD layer 260 can be compensated or counterbalanced by the compensation structure 275.

In some embodiments, after the compensation layer 270 (see FIG. 13) is polished to form the compensation structure 275, the compensation structure 275 may be inspected by a metrology tool to obtain the thicknesses and uniformities of the compensation structure 275, and the measured data of the compensation structure 275 and may be fed forward a tool of a subsequent process. Moreover, in some embodiments, after the compensation layer 270 is polished, a baking step may be performed to the compensation structure 275, such that the compensation structure 275 is cured before the inspection of the compensation structure 275. Therefore, the accuracy of inspecting the thickness and uniformity of the buffed compensation structure 275 may be improved.

Figure 15:
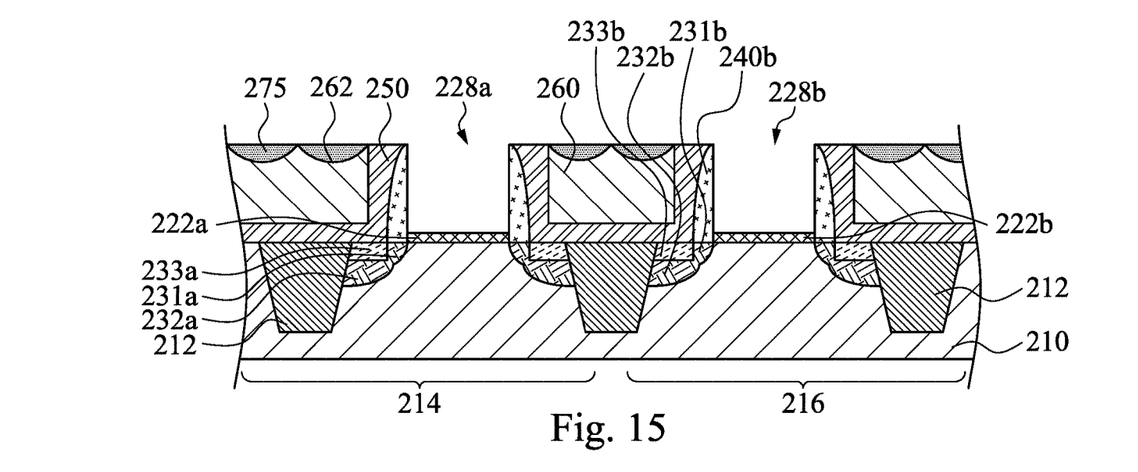

Referring to FIGS. 14 and 15, since the dummy gate electrode layer 226a of the gate stack 220a and the dummy gate electrode layer 226b of the gate stack 220b are exposed, the dummy gate electrode layers 226a and 226b may be removed using suitable etching process to form openings 228a and 228b.

Referring to FIGS. 15 and 16, the openings 228a and 228b are filled with a metallic material 280. The metallic material 280 has a low resistivity and good gap-filling capability. In some embodiments, the metallic material 280 may include tungsten containing materials such as tungsten and tungsten nitride, ruthenium-containing materials such as ruthenium and ruthenium oxide, molybdenum-containing materials such as molybdenum and molybdenum nitride, and combinations thereof. Next, referring to FIG. 17, the excess metallic material 280 outside the openings 228a and 228b may be removed, which may be performed either by a CMP process or a wet etch. The leftover metallic material 280 forms gate electrodes 280a and 280b (i.e., metal gate).

Figure 18:
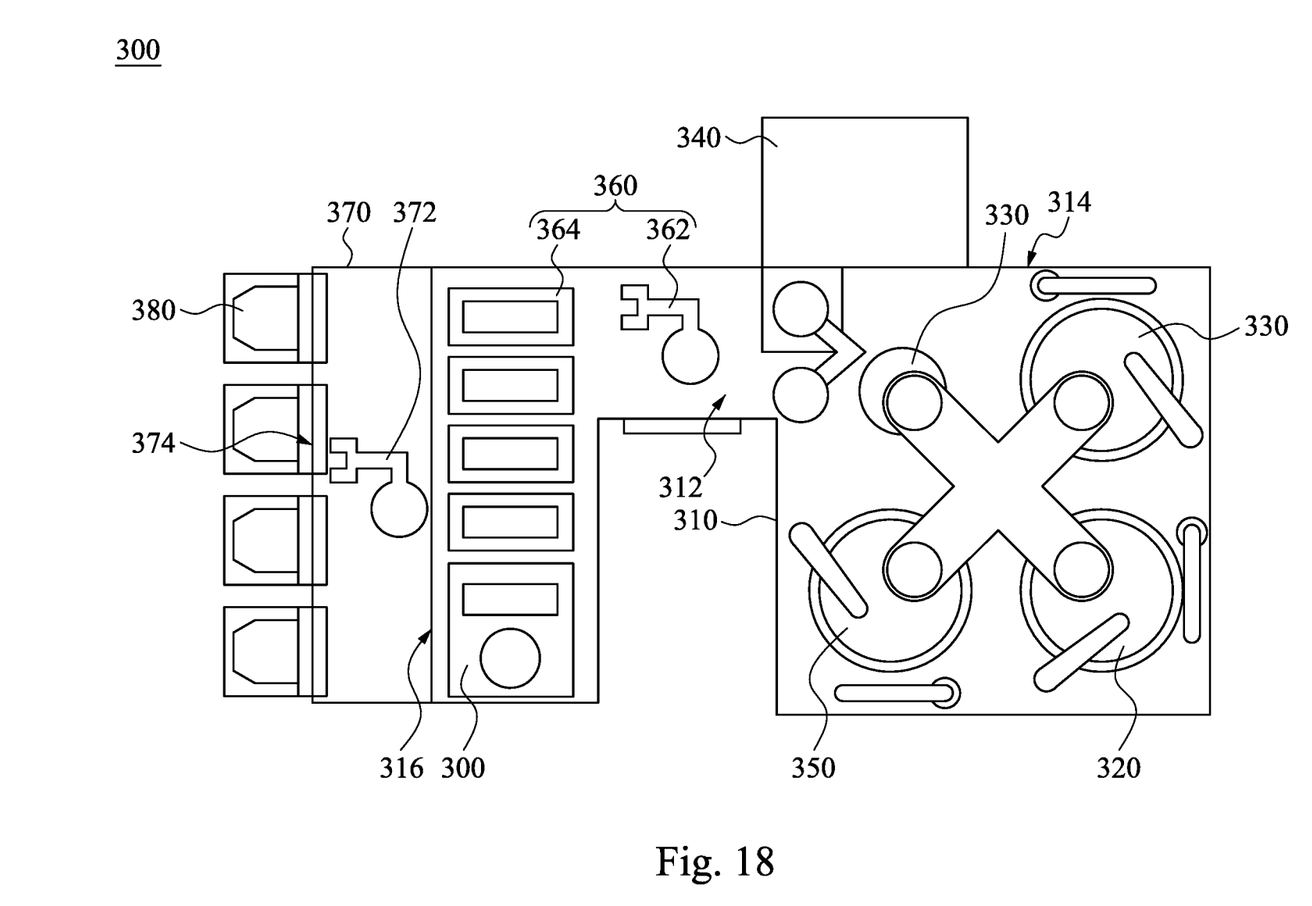
FIG. 18 is a plan view of a manufacture apparatus according to some embodiments of the present disclosure.

FIG. 18 is a plan view of a manufacture apparatus 300 according to some embodiments of the present disclosure. The manufacture apparatus 300 may be used to form the structures shown in FIGS. 6 and 14. The manufacture apparatus 300 includes a housing 310, at least one polishing tool 320, at least one buffing tool 330, a compensation tool 340, a metrology tool 350, and a transfer tool 360. The housing 310 has an accommodating space 312. The polishing tool 320, the buffing tool 330, the metrology tool 350, and the transfer tool 360 are disposed in the accommodating space 312 of the housing 310. The buffing tool 330 is next to the polishing tool 320, and the removal rate of polishing performed by the buffing tool 330 is lower than the removal rate of polishing performed by the polishing tool 320. The compensation tool 340 is coupled to a side 314 of the housing 310, and the buffing tool 330 is disposed between the compensation tool 340 and the polishing tool 320. The transfer tool 360 may transfer a workpiece (e.g., a semiconductor structure) between the metrology tool 350 and the buffing tool 330.

When the manufacture apparatus 300 is in operation, a semiconductor structure having the dielectric layer 150 of FIG. 3 may be polished in the polishing tool 320. Thereafter, the semiconductor structure is transferred to the compensation tool 340. The compensation tool 340 forms the compensation layer 160 of FIG. 5 to cover the dielectric layer 150. The compensation tool 340 may be a spin coating tool, a chemical vapor deposition (CVD) tool, or an atomic layer deposition (ALD) tool. Next, the semiconductor structure is transferred to the metrology tool 350 through the transfer tool 360. In some embodiments, the transfer tool 360 includes a transfer robot 362 and at least one conveyor 364. The transfer robot 362 is next to the buffing tool 330, and the conveyor 364 is between the transfer robot 362 and the metrology tool 350. After the compensation layer 160 of the semiconductor structure is formed, the transfer robot 362 transfers the semiconductor structure from the compensation tool 340 to the conveyor 364, and then the conveyor 364 transfers the semiconductor structure to the metrology tool 350. As a result, the compensation layer 160 may be inspected by the metrology tool 350 to obtain the thickness and uniformity of the compensation layer 160, and the measured data of the compensation layer 160 may be fed forward the buffing tool 330. Through the inspection of the compensation layer 160, a step time of buffing the compensation layer 160 in the buffing tool 330 may be determined.

Thereafter, the semiconductor structure is transferred to the buffing tool 330 for polishing the compensation layer 160 in accordance with the step time, such that the semiconductor structure of FIG. 6 may be obtained. In some embodiments, the manufacture apparatus 300 includes a buffer chamber 370 and at least one cassette holder. The buffer chamber 370 is coupled to a side 316 of the housing 310, and has a transfer robot 372 therein. The cassette holder 380 is coupled to a side 374 of the buffer chamber 370 facing away from the conveyor 364 or the metrology tool 350. In other words, the side 374 of the buffer chamber 370 is opposite the side 316 of the housing 310. After the metrology tool 350 inspects the semiconductor structure, the transfer robot 372 transfers the semiconductor structure from the metrology tool 350 to the cassette holder 380, and then transfers the semiconductor structure to the conveyor 364. Next, the transfer robot 362 may transfer the semiconductor structure from the conveyor 364 to the buffing tool 330.

In some embodiments, in order to increase productivity, the manufacture apparatus 300 may include a pair of polishing tools 320 and a pair of buffing tools 330 in the accommodating space 312 of the housing 310. Various embodiments of the present disclosure are not limited to the number of polishing tools 320 and the number of buffing tools 330.

In alternative embodiments, when the manufacture apparatus 300 is in operation, a semiconductor structure having the CESL 250 and the ILD layer 260 of FIG. 11 may be polished in the polishing tool 320. Thereafter, the semiconductor structure is transferred to the compensation tool 340. The compensation tool 340 forms the compensation layer 270 of FIG. 13 to cover the CESL 250. Next, the semiconductor structure is transferred to the metrology tool 350 through the transfer tool 360. In some embodiments, the transfer robot 362 transfers the semiconductor structure from the compensation tool 340 to the conveyor 364, and then the conveyor 364 transfers the semiconductor structure to the metrology tool 350. As a result, the compensation layer 270 may be inspected by the metrology tool 350 to obtain the thickness and uniformity of the compensation layer 270, and the measured data of the compensation layer 270 may be fed forward the buffing tool 330. Through the inspection of the compensation layer 270, a step time of polishing the compensation layer 270 in the buffing tool 330 may be determined.

Thereafter, the semiconductor structure is transferred to the buffing tool 330 for polishing the compensation layer 270 and the CESL 250 in accordance with the step time, such that the semiconductor structure of FIG. 14 may be obtained. In some embodiments, the transfer robot 372 transfers the semiconductor structure from the metrology tool 350 to the cassette holder 380, and then transfers the semiconductor structure to the conveyor 364. Next, the transfer robot 362 may transfer the semiconductor structure from the conveyor 364 to the buffing tool 330.

Embodiments of the present disclosure have at least following advantages. Compensation layer over a polished layer or structure, such as polished STI structures or polished ILD layer, may be advantageous to compensate "dishing" of the polished layer or structure. This is due to the fact that the compensation layer is non-conformally formed over the polished layer or structure and hence can have top surface with less curvature than that of top surface of the polished layer or structure.

In accordance with some embodiments of the present disclosure, a semiconductor structure includes a semiconductor substrate, a shallow trench isolation (STI) structure, and at least one compensation layer. The semiconductor substrate has at least one trench. The STI structure is in the trench and has a top surface that is distal to a bottom of the trench. The compensation layer is over the top surface of the STI structure, and the compensation layer has a top surface with less curvature than that of the top surface of the STI structure.

In accordance with some embodiments of the present disclosure, a semiconductor structure includes a semiconductor substrate, a plurality of source/drain regions, an interlayer dielectric, and a compensation structure. The source/drain regions are in the semiconductor substrate. The interlayer dielectric is over the source/drain regions and has a top surface distal to the semiconductor substrate. The compensation structure is over the top surface of the interlayer dielectric, and the compensation structure has a top surface with less curvature than that of the top surface of the interlayer dielectric.

In accordance with some embodiments of the present disclosure, a planarization method includes forming a dielectric layer over a polish stop layer. The dielectric layer is polished until reaching the polish stop layer, and the polished dielectric layer has a concave top surface. A compensation layer is formed over the concave top surface. The compensation layer is polished.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A planarization method, comprising:
   forming a polish stop layer over a first gate stack and a second gate stack;
   forming a dielectric layer over the polish stop layer;
   when the dielectric layer covers an entirety of the polish stop layer, initiating a chemical mechanical polish (CMP) process on the dielectric layer and the polish stop layer, wherein the CMP process causes the dielectric layer to have a concave top surface, and the concave top surface of the dielectric layer has two concave portions separated by a tip, wherein a first portion of the polish stop layer over a top surface of the first gate stack is removed to expose the top surface of the first gate stack, while a second portion of the polish stop layer remains over a top surface of the second gate stack;
   after the CMP process, curing the dielectric layer;
   after curing the dielectric layer, inspecting the dielectric layer to obtain measured data;
   forming, by a spin coating process, a compensation layer over the concave top surface based on the measured data, wherein the spin coating process results in the compensation layer having a flat top surface vertically overlapping the concave top surface of the dielectric layer, and wherein the compensation layer comprises SiCl4, SiH4, or $C_xO_yN_z$;
   polishing the compensation layer; and
   after polishing the compensation layer, baking the compensation layer.

2. The planarization method of claim 1, wherein the forming the compensation layer comprises:
   forming the compensation layer non-conformally over the concave top surface of the dielectric layer.

3. The planarization method of claim 1, wherein the forming the compensation layer comprises:
   coating a layer of compensation material over the concave top surface of the dielectric layer; and
   baking the layer of compensation material.

4. The planarization method of claim 1, wherein the polishing the compensation layer comprises:
   using a removal rate less than a removal rate of the CMP process on the dielectric layer to polish the compensation layer.

5. The planarization method of claim 1, wherein forming the compensation layer over the concave top surface is performed such that the compensation layer is in contact with the top surface of the first gate stack.

6. The planarization method of claim 1, wherein forming the compensation layer over the concave top surface is performed such that the compensation layer is separated from the top surface of the second gate stack by the second portion of the polish stop layer.

7. The planarization method of claim 1, wherein forming the compensation layer over the concave top surface is performed such that a distance between the flat top surface of the compensation layer and the concave top surface of the dielectric layer is greater than a distance between the flat top surface of the compensation layer and the top surface of the first gate stack.

8. The planarization method of claim 1, wherein after the CMP process stops, the dielectric layer has a the tip is spaced apart from the first and second gate stacks and is substantially level with the top surfaces of the first and second gate stacks.

9. The planarization method of claim 8, wherein after forming the compensation layer over the dielectric layer and the polish stop layer, the tip of the dielectric layer is higher than a bottom of the compensation layer.

10. The planarization method of claim 1, wherein the compensation layer is formed in contact with the two concave portions of the concave top surface of the dielectric layer.

11. A planarization method, comprising:
forming a polish stop layer over a first gate stack and a second gate stack;
forming a dielectric layer over the polish stop layer;
when the dielectric layer covers an entirety of the polish stop layer, initiating a chemical mechanical polish (CMP) process on the dielectric layer and the polish stop layer, wherein the CMP process causes the dielectric layer to have a concave top surface, and the concave top surface of the dielectric layer has two concave portions separated by a tip, wherein a first portion of the polish stop layer over a top surface of the first gate stack is removed to expose the top surface of the first gate stack, while a second portion of the polish stop layer remains over a top surface of the second gate stack;
forming a compensation layer over the concave top surface of the dielectric layer, wherein the compensation layer is separated from the second gate stack by the polish stop layer but in contact with the first gate stack, and the compensation layer is thinner over the second gate stack than over the first gate stack;
before polishing the compensation layer, inspecting the compensation layer to obtain measured data;
based on the measured data, polishing the compensation layer to form a top surface of the compensation layer with less curvature than that of the top surface of the dielectric layer, wherein a step time of polishing the compensation layer is determined based on the measured data;
after polishing the compensation layer, curing the compensation layer; and
after curing the compensation layer, inspecting the compensation layer.

12. The planarization method of claim 11, wherein the forming the compensation layer comprises:
forming the compensation layer non-conformally over the top surface of the dielectric layer.

13. The planarization method of claim 11, wherein the forming the compensation layer comprises:
coating a layer of compensation material over the top surface of the dielectric layer; and
baking the layer of compensation material.

14. The planarization method of claim 11, further comprising:
baking the dielectric layer after the CMP process.

15. The planarization method of claim 11, wherein the polishing the compensation layer comprises:
using a removal rate less than a removal rate of the CMP process on the dielectric layer to polish the compensation layer.

16. A planarization method, comprising:
forming a polish stop layer over a first gate stack and a second gate stack;
forming a dielectric layer over the polish stop layer;
when the dielectric layer covers an entirety of the polish stop layer, initiating a chemical mechanical polish (CMP) process on the dielectric layer and the polish stop layer, wherein the CMP process causes the dielectric layer to have a concave top surface, and the concave top surface of the dielectric layer has two concave portions separated by a tip, wherein a first portion of the polish stop layer over a top surface of the first gate stack is removed to expose the top surface of the first gate stack, while a second portion of the polish stop layer remains over a top surface of the second gate stack, wherein a first removal rate is used in the CMP process performed on the dielectric layer and the polish stop layer;
forming, by a spin coating process, a compensation layer over the dielectric layer and the polish stop layer, wherein the compensation layer has a flat top surface spanning across an entirety of the dielectric layer;
before reaching the polish stop layer, polishing the compensation layer by using a second removal rate less than the first removal rate;
after polishing the compensation layer, curing the compensation layer; and
after curing the compensation layer, inspecting the compensation layer.

17. The planarization method of claim 16, wherein before the forming the dielectric layer, the method further comprises:
forming the first and second gate stacks over a semiconductor substrate.

18. The planarization method of claim 16, further comprising:
forming a first spacer and a second spacer respectively along sidewalls of the first and second gate stacks, wherein the first spacer is between the polish stop layer and the first gate stack, and the second spacer is between the polish stop layer and the second gate stack.

19. The planarization method of claim 16, wherein before the forming the dielectric layer, the method further comprises:
forming a plurality of source/drain regions in a semiconductor substrate; and
forming the polish stop layer over the source/drain regions.

20. The planarization method of claim 16, wherein before the forming the dielectric layer, the method further comprises:
forming a shallow trench isolation (STI) region in a semiconductor substrate; and
forming the polish stop layer over the STI region.

* * * * *